US010746550B2

(12) United States Patent
Strandjord et al.

(10) Patent No.: US 10,746,550 B2
(45) Date of Patent: Aug. 18, 2020

(54) RESONATOR FIBER-OPTIC GYRO WITH QUADRATURE ERROR REDUCER

(71) Applicant: Honeywell International Inc., Morris Plains, NJ (US)

(72) Inventors: Lee K. Strandjord, Tonka Bay, MN (US); Glen A. Sanders, Scottsdale, AZ (US); Marc Smiciklas, Phoenix, AZ (US)

(73) Assignee: Honeywell International Inc., Morris Plains, NJ (US)

( * ) Notice: Subject to any disclaimer, the term of this patent is extended or adjusted under 35 U.S.C. 154(b) by 98 days.

(21) Appl. No.: 16/052,024

(22) Filed: Aug. 1, 2018

(65) Prior Publication Data
US 2020/0041269 A1    Feb. 6, 2020

(51) Int. Cl.
*G01C 19/72* (2006.01)
*H03D 7/16* (2006.01)
*H04L 27/38* (2006.01)

(52) U.S. Cl.
CPC ......... *G01C 19/727* (2013.01); *G01C 19/721* (2013.01); *H03D 7/165* (2013.01); *H04L 27/3863* (2013.01)

(58) Field of Classification Search
CPC .... G01C 19/727; G01C 19/721; H03D 7/165; H04L 27/3863
See application file for complete search history.

(56) References Cited

U.S. PATENT DOCUMENTS 4,687,330 A * 8/1987 Lefevre ............... G01C 19/726
356/464
5,781,300 A    7/1998 Strandjord et al.
(Continued)

FOREIGN PATENT DOCUMENTS

CN    103983261 B    2/2017
CN    106918351 A    7/2017
(Continued)

OTHER PUBLICATIONS

European Patent Office, "Extended European Search Report from EP Application No. 19177541.0", from Foreign Counterpart to U.S. Appl. No. 16/052,024, dated Dec. 4, 2019, pp. 1-5, Published: EP.

*Primary Examiner* — Tarifur R Chowdhury
*Assistant Examiner* — Jonathon Cook
(74) *Attorney, Agent, or Firm* — Fogg & Powers LLC

(57) ABSTRACT

A resonance fiber-optic gyro (RFOG) with quadrature error reducer is provided. The RFOG with quadrature error reducer includes a laser assembly, a fiber resonator assembly, a resonance tracking loop and a quadrature error reducer circuit. The resonance tracking loop, coupled to an output of the finder resonator assembly, is used to generate a resonance frequency signal that is coupled to an OPLL mixer in one of a CCW OPLL or the CW OPLL of the laser assembly. The quadrature error reducer circuit includes an amplitude control loop and a second harmonic phase control loop. The amplitude control loop is used to generate a common modulation signal. An output of the amplitude control loop is coupled to a common phase modulator in the laser assembly. The second harmonic phase control loop is used to selectively adjust a phase of a second harmonic modulation signal in the amplitude control loop at startup.

13 Claims, 6 Drawing Sheets

(56) References Cited

U.S. PATENT DOCUMENTS

| | | | |
|---|---|---|---|
| 6,310,513 B1 | 10/2001 | Iemura | |
| 8,294,900 B2 | 10/2012 | Strandjord et al. | |
| 8,699,034 B2 | 4/2014 | Strandjord et al. | |
| 8,830,479 B2 | 9/2014 | Qiu et al. | |
| 9,354,064 B2 | 5/2016 | Strandjord et al. | |
| 9,410,806 B2 | 8/2016 | Ezekwe | |
| 9,683,846 B2 | 6/2017 | Strandjord et al. | |
| 2010/0212424 A1* | 8/2010 | Malvern | G01C 19/5677 73/504.13 |
| 2011/0317228 A1* | 12/2011 | Matsuo | H04N 1/047 358/480 |
| 2017/0146346 A1 | 5/2017 | Strandjord et al. | |

FOREIGN PATENT DOCUMENTS

| | | |
|---|---|---|
| EP | 2233885 A2 | 9/2010 |
| EP | 3173742 A1 | 5/2017 |

* cited by examiner

RESONATOR FIBER-OPTIC GYRO WITH QUADRATURE ERROR REDUCER

STATEMENT REGARDING FEDERALLY SPONSORED RESEARCH OR DEVELOPMENT

This invention was made with Government support under Government Contract Number Ordnance Technology Base Agreement No. 2016-316, Ordnance Agreement No. 1 and 2 awarded by DOTC. The Government has certain rights to the invention.

BACKGROUND

A Resonator Fiber-Optic Gyro (RFOG) has potential to provide the highest possible rotation sensing performance within the smallest possible volume. An RFOG senses rotation by measuring the frequency splitting of resonance frequencies of a fiber ring resonator. To measure the resonance frequencies, the RFOG employs frequency or phase modulation of the laser light used to probe the ring resonator. The resonance detection modulation of the laser frequency or phase produces a signal at the resonator output that is demodulated by a phase sensitive demodulator.

Imperfections in the resonance detection modulation, such as intensity modulation and harmonic distortion, can lead to a large error signal that is approximately 90 degrees (in quadrature) to the primary resonator output signal that is being demodulated. A component of the quadrature error can leak into the in-phase demodulator channel used for detecting resonances if the reference phase of the demodulator is not exactly 90 degrees from the quadrature signal phase. Typically, the large quadrature error is common between the CW and CCW directions of the ring resonator, and therefore subtract out if the phase offsets between the CW and CCW in-phase demodulators and the common quadrature error signal are the same. However, there is always some small difference between the CW and CCW relative reference phase offsets, and thus some quadrature error gets into the rotation measurement. Furthermore, the phase difference between the CW and CCW quadrature errors can drift with temperature or other environmental influences, thus leading to an error in rotation measurement.

One method of controlling the demodulator resonance phase currently used is by introducing a disturbance signal, then controlling the reference phase to zero out a response to the disturbance signal. However, testing has shown a significant drawback to this technique in that the introduction of a disturbance signal typically introduces other unacceptable side effects.

SUMMARY

The following summary is made by way of example and not by way of limitation. It is merely provided to aid the reader in understanding some of the aspects of the subject matter described. Embodiments provide a system and method of reduce the impact of quadrature errors on RFOG performance without introducing unacceptable side effects.

In one embodiment, a resonance fiber-optic gyro (RFOG) with quadrature error reducer is provided. The RFOG with quadrature error reducer includes a laser assembly, a fiber resonator assembly, a resonance tracking loop and a quadrature error reducer circuit. The laser assembly includes a master laser, a clockwise (CW) slave laser, a CW optical phase lock loop (OPLL) to control the CW slave laser, a counter clockwise (CCW) slave laser, a CCW optical phase lock loop (OPLL) to control the CCW slave laser. The CW OPLL is coupled to receive an output of the master laser. The CCW OPLL is coupled to receive an output of the master laser. The fiber resonator assembly includes a first circulator, a second circulator and a fiber coil. The first circulator has a first input coupled to receive a first output of the laser assembly. The second circulator has a first input coupled to receive a second output of the laser assembly. The fiber coil is coupled between first outputs of the first and second circulators. The resonance tracking loop is used to generate a resonance frequency signal. An output of the resonance tracking loop is coupled to an OPLL mixer in one of the CCW OPLL and the CW OPLL of the laser assembly. The quadrature error reducer circuit is coupled to receive a second output of one of the first circulator and the second circulator. The quadrature error reducer circuit includes an amplitude control loop and a second harmonic phase control loop. The amplitude control loop is used to generate a common modulation signal. An output of the amplitude control loop is coupled to a common phase modulator in the laser assembly. The second harmonic phase control loop is used to selectively adjust a phase of a second harmonic modulation signal in the amplitude control loop at startup.

In another example embodiment, a resonance fiber-optic gyro (RFOG) with quadrature error reducer that includes a laser assembly, a fiber resonator assembly, a quadrature error reducer circuit and a switch is provided. The laser assembly includes a master laser, a clockwise (CW) slave laser, a CW optical phase lock loop (OPLL) to control the CW slave laser, a counter clockwise (CCW) slave laser and a CCW optical phase lock loop (OPLL) to control the CCW slave laser. The CW OPLL is coupled to receive an output of the master laser. The CCW OPLL is coupled to receive an output of the master laser. The fiber resonator assembly includes a first circulator, a second circulator and a fiber coil. The first circulator has a first input that is coupled to receive a first output of the laser assembly. The second circulator has a first input that is coupled to receive a second output of the laser assembly. The fiber coil is coupled between first outputs of the first and second circulators. The quadrature error reducer circuit is coupled to receive a second output of one of the first circulator and the second circulator. The quadrature error reducer circuit includes a first demodulator, an in-phase demodulator, a quadrature demodulator, a resonance tracking loop, an amplitude control loop and a second harmonic phase control loop. The first demodulator is used to demodulate a signal from the second output of one of the first circulator and the second circulator at two times a common modulation frequency. The in-phase demodulator is coupled to demodulate an output of the first demodulator at the common modulation frequency. The quadrature demodulator is coupled to also demodulate the output of the first demodulator at the common modulation frequency. The resonance tracking loop has an input that is coupled to receive an output of the in-phase demodulator. The resonance tracking loop is configured to generate a resonance frequency signal. An output of the resonance tracking loop is coupled to an OPLL mixer in one of the CCW OPLL and the CW OPLL of the laser assembly. The amplitude control loop has an input that is coupled to receive an output of the quadrature demodulator. The amplitude control loop is configured to generate a common modulation signal. An output of the amplitude control loop is coupled to a common phase modulator in the laser assembly. The second harmonic phase control loop is used to selectively adjust a phase of a second harmonic modulation signal in the amplitude control loop at startup. The switch is positioned within the resonance tracking loop configured and arranged to open the resonance tracking loop at startup of the RFOG and close the resonance tracking loop when a second harmonic modulation output of zero is achieved.

In yet another embodiment, a method of reducing quadrature error in a resonance fiber-optic gyro (RFOG) is provided. The method includes: Amplitude modulating a second harmonic modulation output from a quadrature demodulator; demodulating an output of an in-phase demodulator at an amplitude modulation frequency; and adjusting the phase of the second harmonic modulation output based at least in part on the demodulated output of the in-phase demodulator until a second harmonic modulation output of zero is achieved.

BRIEF DESCRIPTION OF THE DRAWINGS

Embodiments can be more easily understood and further advantages and uses thereof will be more readily apparent, when considered in view of the detailed description and the following figures in which.

In accordance with common practice, the various described features are not drawn to scale but are drawn to emphasize specific features relevant to the subject matter described. Reference characters denote like elements throughout Figures and text.

DETAILED DESCRIPTION

Figure 1:
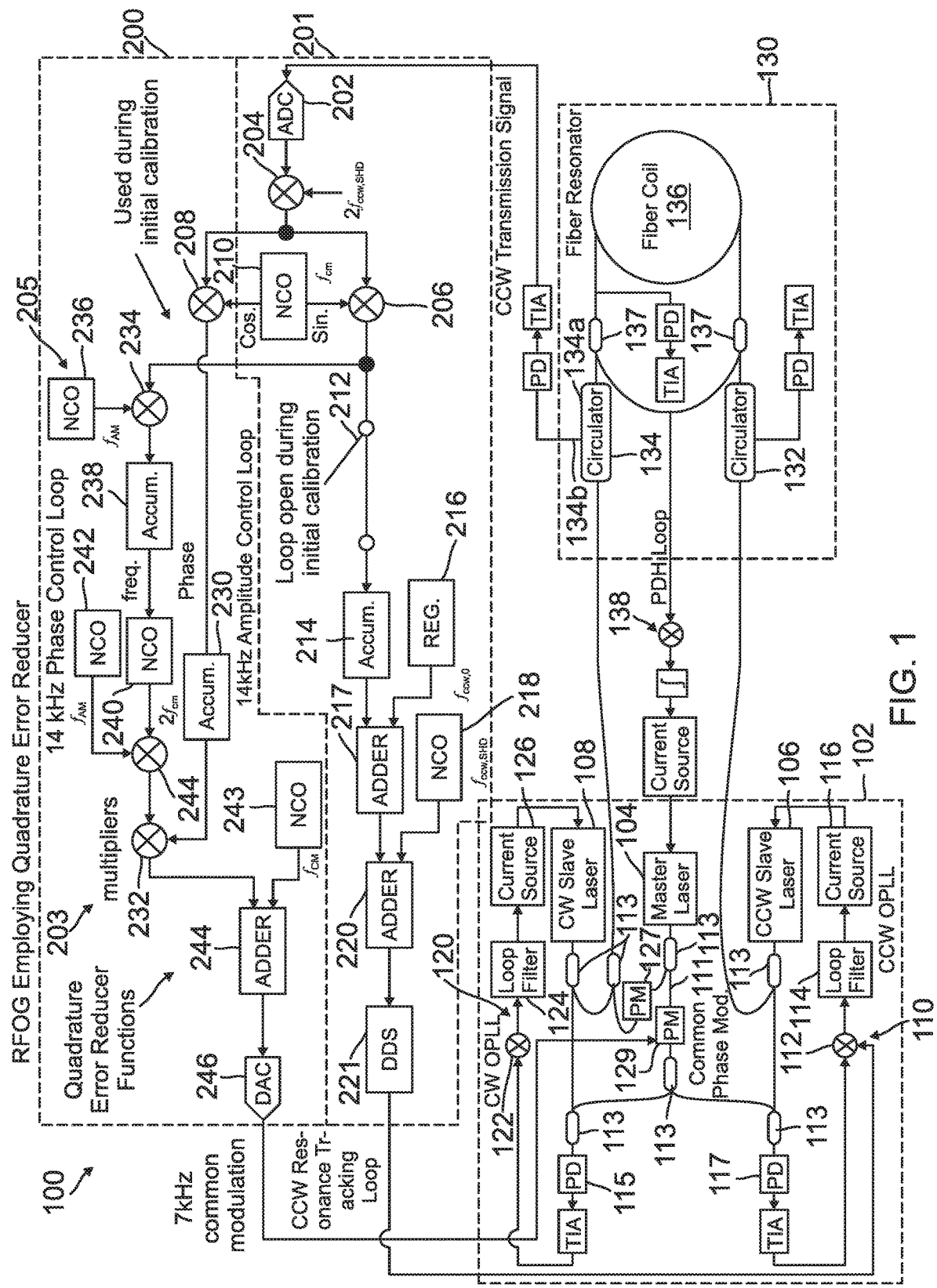
FIG. 1 is a schematic drawing of a resonance fiber-optic gyro (RFOG) with quadrature error reducer according to one exemplary embodiment.

In the following detailed description, reference is made to the accompanying drawings, which form a part hereof, and in which is shown by way of illustration specific embodiments in which the inventions may be practiced. These embodiments are described in sufficient detail to enable those skilled in the art to practice the embodiments, and it is to be understood that other embodiments may be utilized and that changes may be made without departing from the spirit and scope of the present invention. The following detailed description is, therefore, not to be taken in a limiting sense, and the scope of the present invention is defined only by the claims and equivalents thereof.

Embodiments reduce the impact of quadrature errors on performance of Resonator Fiber-Optic Gyros (RFOGs) without the need for introducing a disturbance signal or modulation. In one embodiment, the impact of quadrature errors is done within firmware of the RFOG digital signal processing. This embodiment therefore does not require any additional hardware. Moreover, by reducing the impact of quadrature error, requirements on laser frequency or phase modulation integrity can be greatly relaxed. The relaxed requirements may allow for the use of laser modulator hardware that is far less expenses, such as modulators employed in silicon photonics chips.

Embodiments employ a phase sensitive demodulator (quadrature demodulator) that has a reference that is nearly exactly 90 degrees out of phase with the in-phase demodulator that is used to detect resonance, thus detect rotation. Further in embodiments a numerically controlled oscillator may be used that has both a sine and cosine output to produces two reference signals with a great degree of orthogonality. The sine output is used for the in-phase modulator and the cosine output for the quadrature demodulator. The in-phase modulator is used for resonance detection and tracking. The quadrature demodulator is used in a feedback loop that adjusts the amplitude of a modulation signal that is at twice the frequency (second harmonic) of the laser frequency or phase modulation. The second harmonic signal is added to the primary modulation signal before being sent to a laser assembly of the RFOG as discussed below.

The second harmonic signal generates a resonator output signal with a phase mostly in-line with the quadrature demodulator. A quadrature reduction loop (or second harmonic phase control loop) adjusts a second harmonic signal amplitude (in a amplitude control loop) until it cancels out the quadrature error due to modulation imperfections. With little or zero quadrature error, there will be very little or no quadrature error leaking into the in-phase channel and causing rotation sensing errors. During gyro startup, the quadrature error reducer can go through a startup sequence, in an embodiment that optimizes the phase of the second harmonic signal so that it generates a resonator output signal that is mostly in quadrature with the in-phase demodulator. During startup, after the resonance tracking loop acquires the resonance frequency, it temporarily opens up to allow optimization of the second harmonic modulation phase. The second harmonic modulation signal is temporarily amplitude modulated at some AM frequency. The output of the in-phase demodulator is demodulated again at the AM frequency. The output of the second demodulation is proportional to the amount of second harmonic induced signal that gets into the in-phase channel. The temporary second harmonic phase control loop adjusts the phase of the second harmonic modulation signal until the second demodulator output is zero. At this point, there is no second harmonic modulation induced signal in the in-phase channel and all is in quadrature. The second harmonic phase control loop opens and the resonance tracking loop closes and normal gyro operation begins.

Outputs of components are described below as being coupled to inputs of other components. The term "coupled" used herein means that an output of a component may be directly coupled to an input of another component or that an output of the component may pass through, and may be processed by, one or more other components before it is passed to an input of a final component.

Referring to FIG. 1, an RFOG 100 of an embodiment is illustrated. The RFOG 100 includes a laser assembly 102, a fiber resonator assembly 130, a counterclockwise (CCW) resonance tracking loop 201 and a quadrature error reducer circuit 200. The laser assembly 102 includes a master laser 104, counterclockwise (CCW) slave laser 106 and a clockwise (CW) slave laser 108. Outputs of the lasers 104, 106 and 108 are coupled to waveguides 111. In one embodiment the waveguides 111 are formed in a silicon photonics (SiP) chip along with waveguide beam splitters/combiners 113 that are used to direct laser beams from the respective master laser 104, the CCW slave laser 106 and the CW slave laser 108 thought the laser assembly 102. Also formed in the SiP chip, in an embodiment, are phase modulator 127 and common phase modulator 129. Common phase modulator 129 receives a common modulation signal from the amplitude control loop 203 of the quadrature error reducer circuit 200 as further discussed below. In one embodiment, the common modulation is at 7 KHz.

An output of a first photodiode 115 of the SiP chip is coupled to a CW optical phase lock loop (OPLL) 120. The CW OPPL 120 in this embodiment includes a mixer 122, a loop filter 124 and a current source 126. The CW OPLL 120 controls the frequency of CW slave laser 108. An output of a second photodiode 117 of the SiP chip is combined with a CCW resonance tracking loop 201 output using a mixer 112 in a CCW OPLL 110. The CCW OPLL 110 in this example embodiment further includes a loop filter 114 and current source 116. The CCW OPLL 110 controls the frequency of the CCW slave laser 106. The two slave lasers 106 and 108 lock onto the master laser 104 using the respective phase locked loops 110 and 120.

An output signal of the CCW resonance tracking loop 201 is used to fine tune the CCW slave laser 106 onto a resonance center at a transmission peak of the fiber resonator assembly 130 discussed below. In particular, even though the master laser 104 locks the slave lasers 106 and 108 close to resonance (or locks the carrier frequencies of the slave lasers at close to a half free spectral range away from a resonance), the CCW resonance tracking loop 201 is used to lock it right on the resonance center (or exactly a half free spectral range from resonance center).

The fiber resonator assembly 130 of this example embodiment includes circulator 132 that is coupled to receive an output from the CCW slave laser 106 and circulator 134 that is coupled to receive an output from the master laser 104 and the CW slave laser 108. A fiber coil 136 of the fiber resonator assembly 130 is coupled between an output of the circulator 132 and an output 134a of circulator 134. A second output 134b of the circular 134 is provided as an input to the quadrature error reducer circuit 200. In one example embodiment, the circulators 134 and 132 and waveguide beam splitters/combiners 137 that couple the circulators 134 and 132 to the fiber coil 136 and the PDH loop 138 are formed in a silicon optional bench (SiOB). A Pound-Drever-Hall (PDH) loop 138 that is coupled between the fiber coil 136 is coupled to the control to the master laser 104 in this example embodiment. The PDH loop 138 is used to lock the master laser 104 on the resonator of the resonator assembly 130 (or lock at least one sideband of the master laser on resonance of the resonator assembly).

The quadrature error reducer circuit 200 and resonance tracking circuit 201 (also shown in the close up view of FIG. 2) includes an analog to digital converter (ADC) 202 that is coupled to the second output 134b of circulator 134 of the fiber resonator assembly 130. An output of ADC 202 is demodulated with a reference signal at twice a CCW sideband heterodyne detection (SHD) modulation frequency ($2f_{ccw, SHD}$) with a first demodulator that includes mixer 204. Backscattered light from the CW direction will produce a signal at twice the CW SHD modulation frequency ($2f_{cw, SHD}$) which is different than the CCW demodulation frequency and therefore is rejected by mixer 204. An output of mixer 204 is demodulated a second time by either a second demodulator (in-phase demodulator) whose output is coupled to a CCW resonance tracking loop 201 or a third demodulator (quadrature demodulator) whose output is coupled to an amplitude control loop 203.

The in-phase common demodulator includes mixer 206. Mixer 206 has a first input coupled to receive an output of mixer 204 and a second input to receive a first output of a numerically controlled oscillator (NCO) 210. The first output of the NCO 210, in an embodiment, is provided at an in-phase sine signal at a common modulation frequency ($f_{cm}$). The quadrature demodulator includes mixer 208. Mixer 208 has a first input coupled to receive an output of mixer 204 and a second input to receive a second output of NCO 210. The second output of the NCO 210, in an embodiment, is provided at an out of phase cosine signal at a common modulation frequency. In an example embodiment, the common modulation frequency is 7 kHz however other common modulation frequencies could be used.

An output of the in-phase common demodulator 206 is provided to the CCW resonance tracking loop 201 and an output of the quadrature demodulator 208 is provided to an amplitude control loop 203. The CCW resonance tracking loop 201 includes a switch 212 (that is discussed in detail below). Since, the output of the in-phase common demodulator 206 is in phase, the output provides an error signal that indicates if the laser signals from the laser assembly 102 are on resonance or not (or if the laser carrier frequencies are locked at a half free spectral range from resonance, or not). In particular, if the output is zero, either the laser odd sidebands due to SHD modulation or the laser carrier and even SDH modulation sidebands are right on center resonance.

The output of the in-phase common demodulator 206 is selectively coupled (via switch 212) to an input of an accumulator 214 in the CCW resonance tracking loop 201. An output of accumulator 214 is coupled to an input of an adder 217. Adder 217 includes a second input that is coupled to an output of a register 216 that provides a CCW frequency offset value. The register 216 is used to provide a nominal offset frequency between the CCW laser and the master laser. In one example embodiment, a range of nominal offset frequencies used is within a range of 100 to 500 MHz. Before closing the CCW resonance tracking loop 201 via switch 212, the slave lasers 106 and 108 are close to resonance so a small adjustment relative to nominal offset is all that is needed. The output of adder 217 is coupled to a first input of a second adder 220. The second adder 220 includes a second input that is coupled to NCO 218 that provides a CCW SHD modulation frequency. An output of adder 220 is coupled to a direct digital synthesizer (DDS) 221. An output of the DDS 221 of the resonance tracking loop 201 is coupled to mixer 112 in the CCW OPLL loop 110 of the laser assembly 102.

The output of the CCW OPLL loop 110 determines an offset frequency between the CCW slave laser 106 and the master laser 104. Hence, the CCW resonance loop 201 controls and modulates the frequency of the CCW slave laser 106. As discussed above, it is used to fine tune either the slave laser 106 SHD modulation odd or even sidebands to the center of the resonance.

Second harmonic distortion of the common modulation will produce an unwanted laser frequency modulation at twice the common modulation frequency. Second harmonic laser frequency modulation will result in an error signal at the common modulation frequency at the input of the in-phase common demodulator, even when the laser even or odd modulation sidebands are on resonance center. Modulation of the laser light intensity at the common modulation frequency will produce a similar error signal. If a component of the resonator output error signal is in-phase with the in-phase common demodulator, then an error will occur in resonance detection. However, if the CW and CCW resonance detection errors are the same, no error in rotation measurement occurs. Since the common modulation for CW and CCW directions is generated with common electronics and a common phase modulator, the error signals into the CW and CCW common in-phase demodulators will be mostly common.

However, the generation of common frequency modulation on each slave light wave involves the optical phase lock loops (OPLLs). Differences in how the OPLLs respond to the phase modulation on the master light used for the OPLLs will result in small amplitude and phase differences of the CW and CCW second harmonic frequency modulation, and therefore can result in resonance detection and rotation measurement errors. The resulting rotation measurement error depends on the phase of the mostly common error signal into the common in-phase demodulators. If the mostly common error signal is in-phase with the in-phase common demodulator, the output of the in-phase demodulator is mostly sensitive to changes in the error signal amplitude, and relatively insensitive to small changes in the error signal phase. If the mostly common error signal is 90 degrees out of phase with the in-phase common demodulator, then the output of the in-phase common demodulator is sensitive to changes in the error signal phase, and insensitive to changes in the error signal amplitude. In summary, rotation measurement errors are relatively insensitive to changes in phase differences between the CW and CCW error signals that are in-phase with the in-phase demodulators, and are insensitive to changes in amplitude differences between the CW and CCW error signals that are in quadrature to the in-phase demodulators. For a mostly common error signals that is mostly 90 degrees out of phase with the in-phase demodulators, rotation measurement errors can arise in at least two different ways. The first way a rotation measurement error can occur is from small changes in the relative phase difference between the CW and CCW error signals. Another way rotation measurement error can occur is from a fixed difference of the relative phase between the CW and CCW error signals and the corresponding in-phase demodulators, combined with a common change in the error signal amplitudes. The amplitude control loop 203 of the quadrature error reducer circuit 200 is used to control the amplitude of a modulation signal at twice the common modulation frequency to generate a signal at the in-phase demodulator input that cancels out the error signal generated by harmonic distortion and/or amplitude modulation and that is 90 degrees out of phase with the in-phase demodulator. By doing so, the remaining error signals due to harmonic distortion and/or amplitude modulation are all in-phase with the in-phase common demodulators, and therefore the sensitivity of rotation measurement errors to changes in error signal phase is greatly reduced.

Embodiments, use a second harmonic phase control loop 205 to adjust the amplitude control loop 203 to reduce quadrature error. In the amplitude control loop 203, an output of mixer 208 is coupled to an accumulator 230. An output of the accumulator 230 is coupled to a first input to multiplier 232. The amplitude control loop 203, further includes multiplier 244 whose output is coupled to a second input to multiplier 232. A first input to multiplier 244 is coupled to an output of an NCO 242 which acts as an amplitude modulation (AM) generator. A second input to multiplier 244 is coupled to an output of NCO 240 which provides two times the frequency of the common modulation. NCO 240 is further selectively controlled in phase by the second harmonic phase control loop 205 based on the activation of switch 212 in the resonance tracking loop 201. The second harmonic phase control loop 205 includes mixer 234. Mixer 234 has a first input that is selectively coupled to the output of mixer 206 via switch 212. Mixer 234 has a second input that is coupled to NCO 236. NCO 236 is an AM reference generator used for initial calibration. An output of mixer 234 is coupled to accumulator 238. An output of accumulator 238 is coupled to NCO 240.

An output of multiplier 232 is coupled to a first input of adder 245. A second input to adder 245 is coupled to an output of NCO 243 that provides a common modulation frequency. An output of adder 245 is coupled to a digital to analog (DAC) converter 246. An output of the DAC is coupled to common phase modulator 132 in the laser assembly 102.

As discussed above, the amplitude control loop 203 uses the output of mixer 208 (third demodulator), to zero out any quadrature error. The accumulator 230 in the amplitude control loop 205 acts like an integrator in a servo that adjusts an amplitude of a 14 kHz (in an example embodiment) from NCO 240. This amplified signal is then summed in with 7 kHz (in this example embodiment) with adder 244.

During initial calibration, the resonance tracking loop 201 is open via switch 212. This allows an output of the in-phase modulator to deviate from zero. In the 7 kHz common frequency example, the 14 kHz frequency is amplitude modulated at some AM frequency via the amplitude control loop 203. If the phase of this 14 kHz signal is such that it has a component in phase with the in-phase common demodulator 206, the common demodulator 206 will have an output signal at the AM frequency. This is a temporary feedback loop (second harmonic phase control loop 205) that demodulates the output of the in-phase common demodulator 206 at that AM frequency in the amplitude control loop 203. The phase of the 14 kHz modulation is controlled until the common demodulator 206 output signal at the AM frequency goes to zero. Once this is accomplished, the 14 kHz phase control loop is opened, the AM modulation is turned off, the phase of the 14 kHz modulation is held constant, the resonance tracking loop is closed by closing switch 212, and the 14 kHz modulation will generate a 7 kHz signal at the mixer 204 output that is all in-phase with mixer 208 and 90 degrees out of phase with mixer 206.

Figure 2:
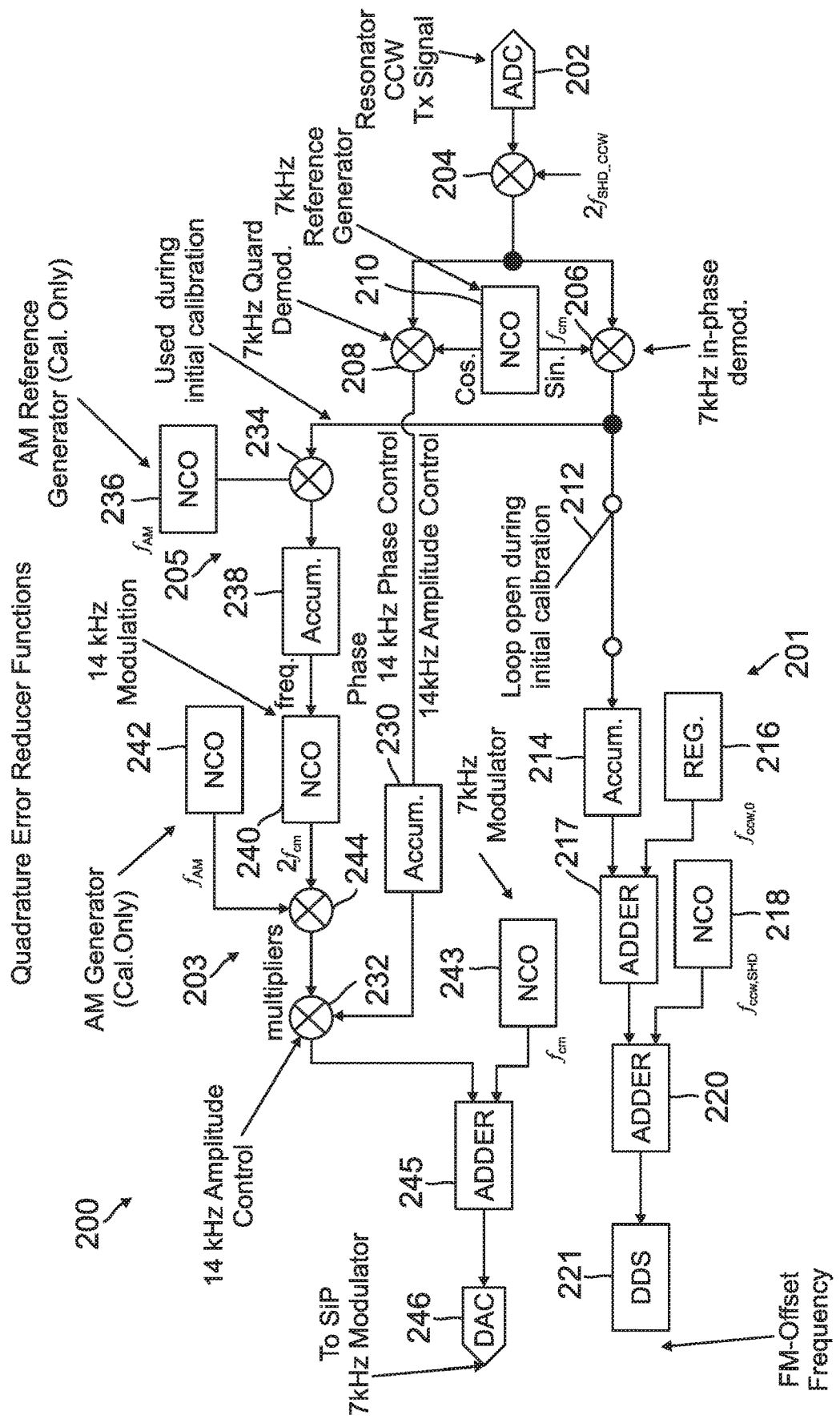
FIG. 2 is a schematic drawing of a quadrature error reducer circuit according to one exemplary embodiment.

Although, FIGS. 1 and 2 only shows CCW processing of the quadrature error reducer circuit 200 there can also be CW processing with a quadrature error reducer circuit. With a CW processing, an output of TIA from the second circulator 132 would be coupled to a CW resonance tracking servo (analogous to the CCW resonance tracking servo) that serves as an input to mixer 122 to control the CW OPPL 120. Both CCW and CW Quadrature errors are correlated with each other in that the quadrature error will follow each other. Only one quadrature error reducer is required, either on the CCW side or CW side.

Figure 3:
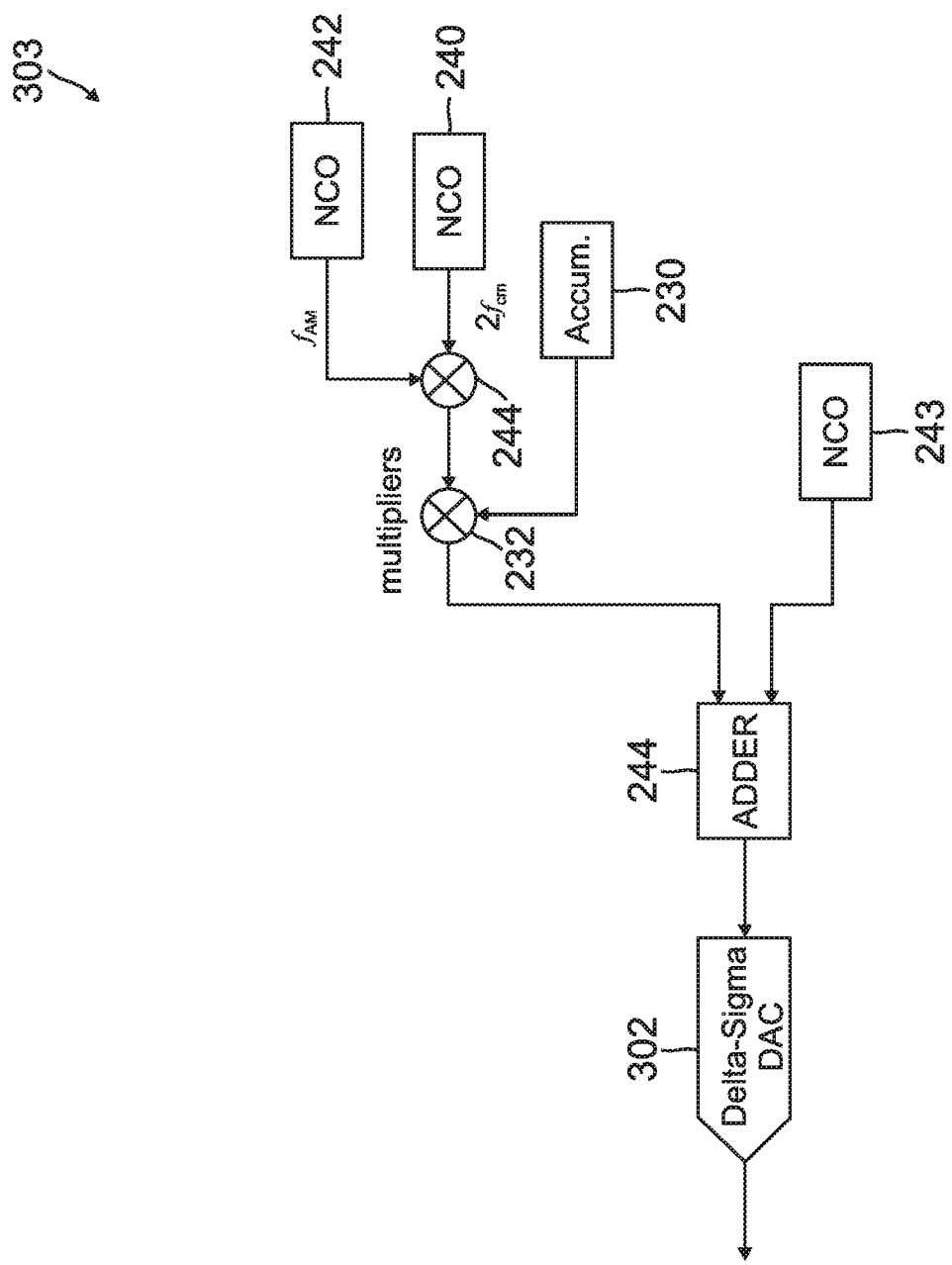
FIG. 3 is a schematic drawing of an amplitude control loop according to one exemplary embodiment.

FIG. 3 illustrates another embodiment of an amplitude control loop 303 to provide the common modulation. This embodiment employs a delta-sigma DAC 302 instead of DAC 246 discussed above. The maximum quadrature error this embodiment has to reduce is due to a maximum second harmonic distortion error of about −70 dBc, referenced to the common modulation amplitude. In this case, the quadrature error needs to be reduced by about 40 dB to meet gyro performance requirements. Therefore, the second harmonic distortion error needs to be reduce to about −110 dBc. A DAC that generates both the common modulation and second harmonic feedback signal needs to have roughly about 110 dB of range, or at least 19 bits of resolution. Delta-sigma DACs can provide a very high resolution (24-bits) for audio signals. The RFOG 100 common modulation and its second harmonic are typically well within the audio frequency band. The 24 bits of resolution provides more than adequate range for this embodiment.

Figure 4:
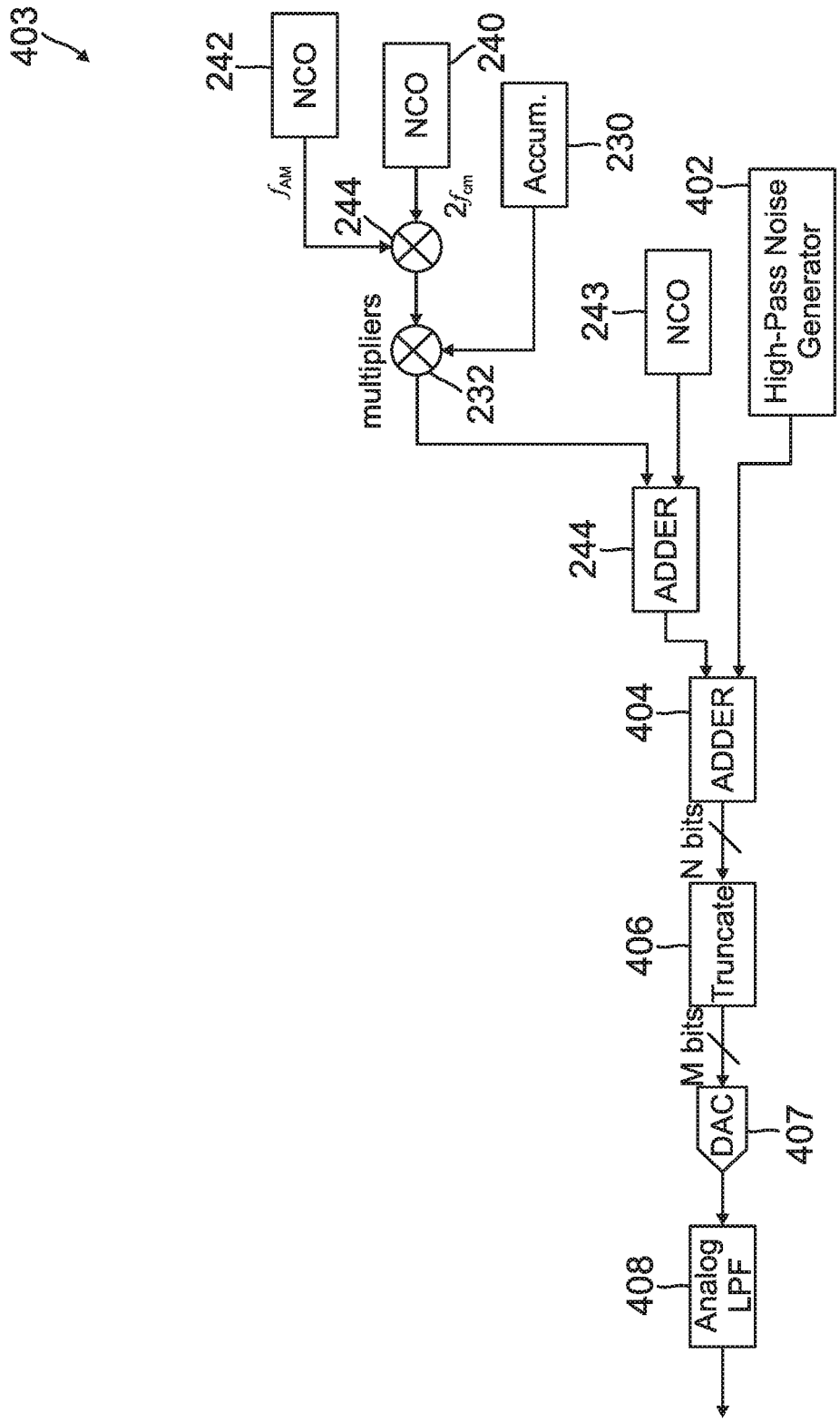
FIG. 4 is a schematic drawing of another amplitude control loop according to one exemplary embodiment.

FIG. 4 further illustrates another embodiment of an amplitude control loop 403 to provide the common modulation. This example embodiment implements a high-pass noise generator 402 whose output is coupled to a second adder 404, a truncate circuit 406, a DAC 407 and an analog low pass filter (LPF) 408.

This embodiment uses the digital noise generator 402 to generate noise having a high-pass spectrum to dither some of the bits of the DAC 407. The total RMS amplitude of the noise may be at least ½ least significant bit (LSB). By using high-pass noise, the noise can be later filtered out of the drive signal with the LPF 408 without significantly attenuating the desired common modulation signal and the second harmonic. Therefore, the bulk of the high-pass noise needs to be in the frequency spectrum that is significantly higher than the common modulation and second harmonic frequencies. An example method of generating high-pass noise is to first generate white noise with a random number generator, then pass the white noise through a high-pass digital filter.

The DAC sampling frequency is set high enough to meet the range requirement of about 110 dB, or at least 19 bits of resolution in an embodiment. The minimum DAC sampling frequency in an embodiment is at least twice the second harmonic modulation frequency to satisfy the Nyquist criteria, otherwise aliasing will occur. The typical second harmonic frequency is about 14 kHz, therefore the minimum DAC sampling frequency needs to be 28 kHz. The DAC 407 resolution is improved by increasing the DAC sample frequency combined with the noise for bit dithering. For example, a 12 bit DAC resolution can be increased by 8 bits by increasing the sample frequency by 256 times the original frequency. Therefore, if the original sample frequency is 28 kHz, increasing the sample frequency to approximately 7.2 MHz, combined with the noise dither, will increase a 12-Bit DAC resolution to 20 bits.

Figure 5:
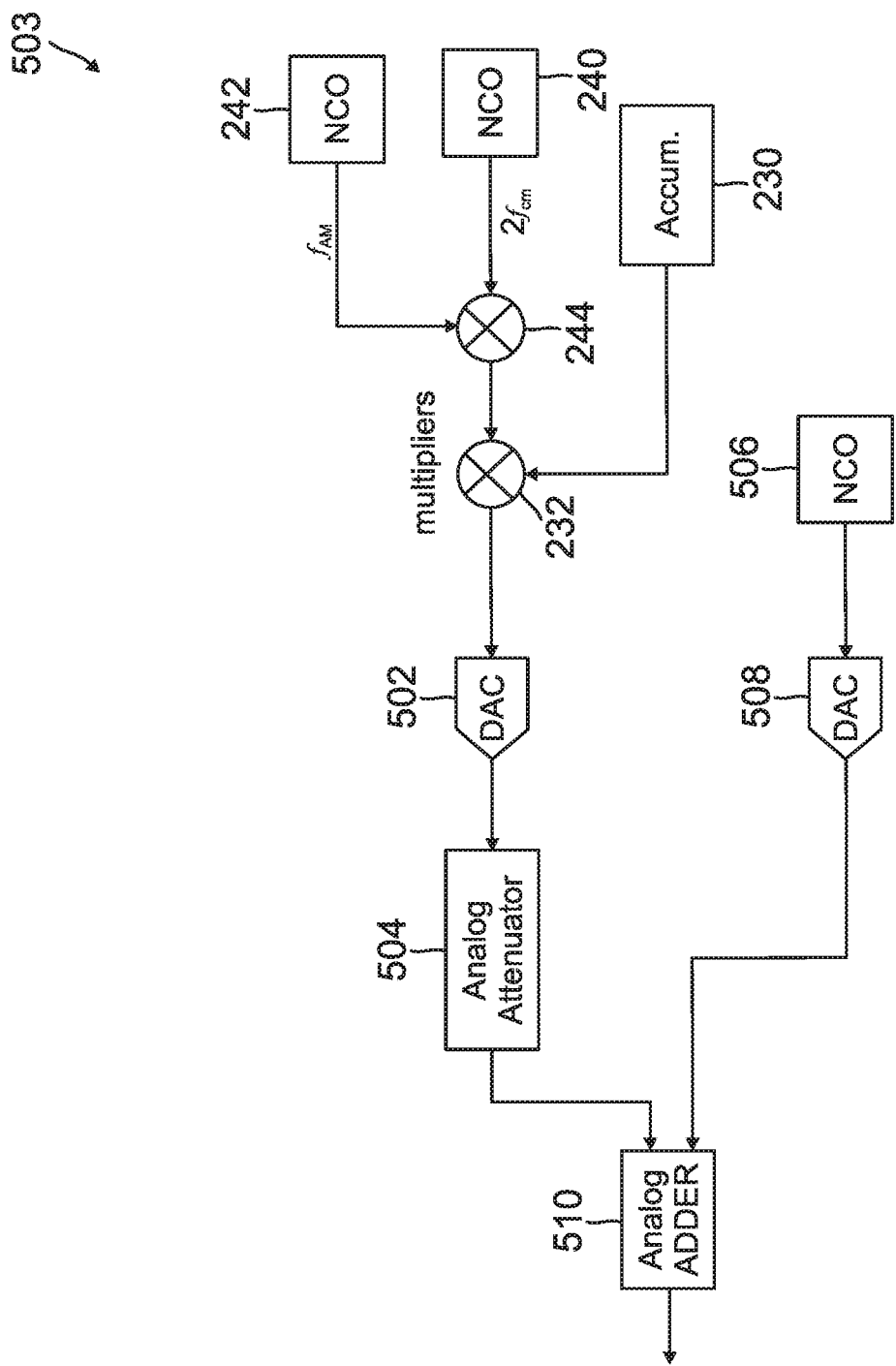
FIG. 5 is a schematic drawing of yet another amplitude control loop according to one exemplary embodiment.

FIG. 5 illustrates yet another embodiment of an amplitude control loop 503 to provide the common modulation. This embodiment includes an analog adder 510 that has a first input that is coupled to receive an output of an analog attenuator 504 that is in turn coupled to receive an output of DAC 502 that is coupled to multiplier 232. The analog adder 510 further has a second input 510 that is coupled to receive and output of a DAC 508 that is in turn coupled to receive an output of NCO 506. By using two DACs 502 and 508, the digital second harmonic signal amplitude can be made relatively large compared to DAC 502 LSB. For example, the nominal amplitude can be made to be $\frac{1}{10}^{th}$ the DAC 502 full range.

Figure 6:
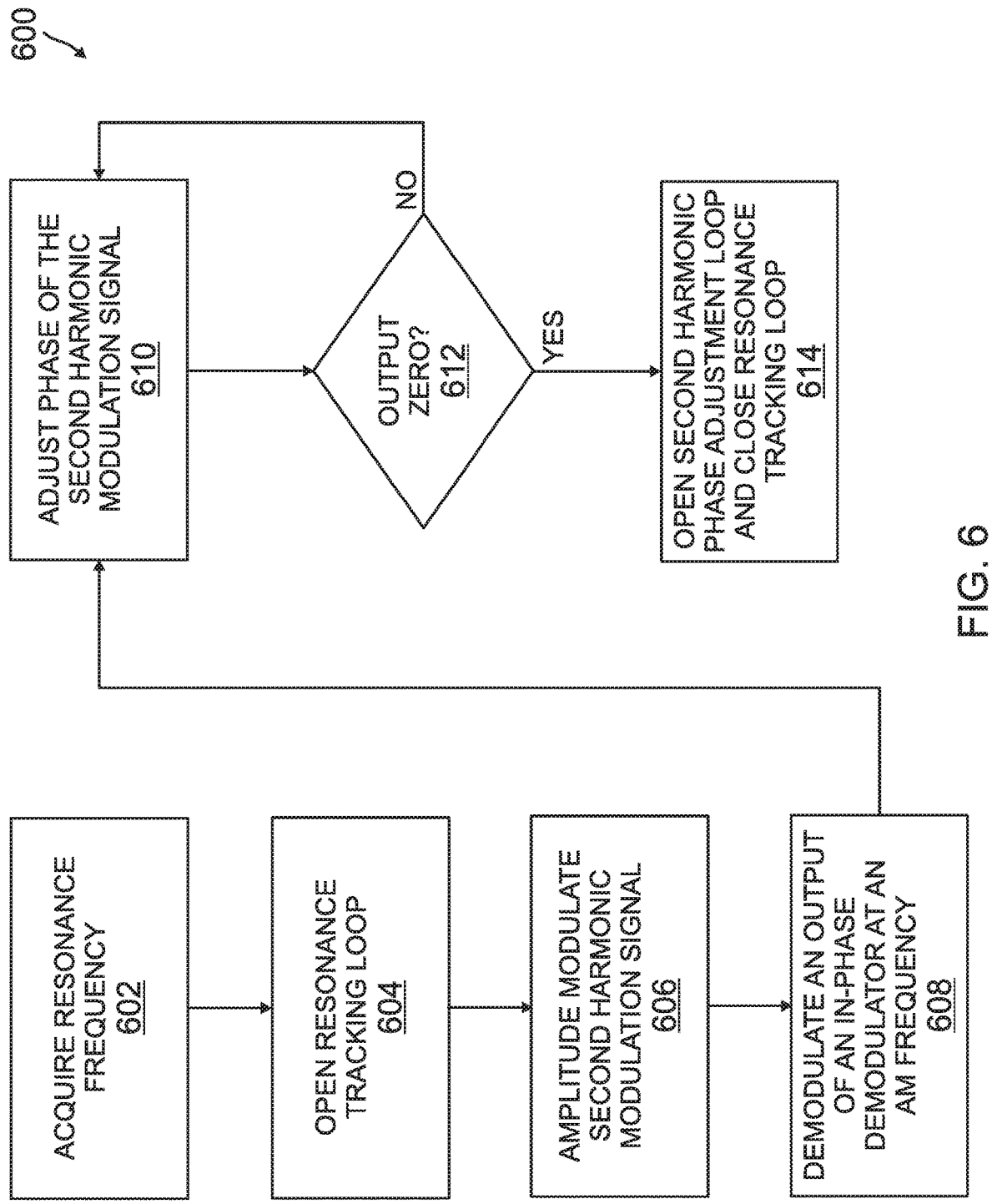
FIG. 6 is a gyro startup flow diagram according to one exemplary embodiment.

Referring to FIG. 6, a gyro startup flow diagram 600 of one embodiment is illustrated. The gyro startup flow diagram is provided as plurality of sequential steps. The sequence of the steps may occur in a different order. Hence, embodiments are not limited to the order set out in FIG. 6. The startup sequence optimizes a phase of the second harmonic signal so that it generates a resonator output signal that is mostly in quadrature with an in-phase demodulator.

The gyro startup flow diagram 600 of FIG. 6 starts by acquiring the resonance frequency with the resonance tracking loop 201 of the quadrature error reducer circuit 200 at step (602). Switch 212 is then opened, which opens the resonance tracking loop 201, at step (604). This allows optimization of the second harmonic modulation phase. While the resonance tracking loop is open, a second harmonic modulation signal is amplitude modulated at some AM frequency at step (606). An output of the in-phase demodulator (output of mixer 206) is demodulated again, at mixer 234, at the AM frequency (provided by NCO 236) at step (608). The output of this second demodulation is proportional to an amount of second harmonic induced signal that gets into the in-phase channel. The phase of the second harmonic modulation signal is adjusted at step (610). This is done via the temporary second harmonic phase control loop 205. In this example embodiment, it is determined if the adjustment has resulted in a zero output at step (612). If the adjustment has not yet resulted in a zero output at step (612), the adjustment of the phase of the second harmonic modulation signal continues at step (610). If the adjustment has resulted in a zero output at step (612), the second harmonic phase adjustment loop is opened and the resonance tracking loop is closed at step (614). This is accomplished by closing switch 212. The switch 212 can be activated in an embodiment with a threshold detector that is designed to turn off the phase control loop 205 when the magnitude of the averaged output mixer 234 drops below a predetermined threshold.

Example Embodiments

Example 1 is a resonance fiber-optic gyro (RFOG) with quadrature error reducer. The RFOG with quadrature error reducer includes a laser assembly, a fiber resonator assembly, a resonance tracking loop and a quadrature error reducer circuit. The laser assembly includes a master laser, a clockwise (CW) slave laser, a CW optical phase lock loop (OPLL) to control the CW slave laser, a counter clockwise (CCW) slave laser, a CCW optical phase lock loop (OPLL) to control the CCW slave laser. The CW OPLL is coupled to receive an output of the master laser. The CCW OPLL is coupled to receive an output of the master laser. The fiber resonator assembly includes a first circulator, a second circulator and a fiber coil. The first circulator has a first input coupled to receive a first output of the laser assembly. The second circulator has a first input coupled to receive a second output of the laser assembly. The fiber coil is coupled between first outputs of the first and second circulators. The resonance tracking loop is used to generate a resonance frequency signal. An output of the resonance tracking loop is coupled to an OPLL mixer in one of the CCW OPLL and the CW OPLL of the laser assembly. The quadrature error reducer circuit is coupled to receive a second output of one of the first circulator and the second circulator. The quadrature error reducer circuit includes an amplitude control loop and a second harmonic phase control loop. The amplitude control loop is used to generate a common modulation signal. An output of the amplitude control loop is coupled to a common phase modulator in the laser assembly. The second harmonic phase control loop is used to selectively adjust a phase of a second harmonic modulation signal in the amplitude control loop at startup.

Example 2, includes the RFOG with quadrature error reducer of Example 1, further wherein the second harmonic phase control loop configured and arranged to provide an output to the amplitude control loop when the resonance tacking loop is opened.

Example 3 includes the RFOG with quadrature error reducer of any of the Examples 1-2, further including a switch within the resonance tracking loop configured and arranged to open the resonance tracking loop at startup of the RFOG and close the resonance tracking loop when a second harmonic modulation output of zero is achieved.

Example 4 includes the RFOG with quadrature error reducer of any of the Examples 1-3, wherein the quadrature error reducer circuit further includes a first demodulator, an in-phase demodulator and a quadrature demodulator. The first demodulator is used to demodulate a signal in the second output of one of the first circulator and the second circulator at two times a common modulation frequency. The in-phase demodulator is coupled to demodulate an output of the first demodulator at the common modulation frequency. An output of the in-phase demodulator is coupled to the resonance tracking loop. The quadrature demodulator is coupled to also demodulate the output of the first demodulator at the common modulation frequency. An output of the quadrature demodulator coupled to the amplitude control loop.

Example 5 includes the RFOG with quadrature error reducer of Example 4, wherein the amplitude control loop (ACL) further includes an accumulator, a first ACL multiplier, a second ACL multiplier, a first ACL and a second ACL. The accumulator has an input coupled to an output of the quadrature demodulator. The first ACL multiplier has a first input coupled to an output of the accumulator. The second ACL multiplier has an output coupled to a second input of the first ACL multiplier. The first ACL numerically controlled oscillator (NCO) has an output coupled to a first input of the second ACL multiplier. The output of the first ACL NCO is at two times the frequency of the common modulation frequency. The second ACL NCO has an output that is coupled to a second input of the second ACL multiplier. The output of the second ACL NCO is at a select amplitude modulation frequency.

Example 6 includes the RFOG with quadrature error reducer of Example 5, wherein the ACL further includes an adder, a third ACL NCO and a digital to analog converter (DAC). The adder has a first input that is coupled to an output of the first ACL mixer. The third ACL NCO has an output coupled to a second input of the adder. The DAC has an input that is coupled to an output of the adder. An output of the DAC coupled to the common phase modulator in the laser assembly.

Example 7 includes the RFOG with quadrature error reducer of Example 6, wherein the DAC of the ACL is a delta-sigma DAC.

Example 8 includes the RFOG with quadrature error reducer of Example 5, wherein the ACL further includes a first adder. A third ACL NCO, a second adder, a high-pass noise generator, a truncate, a digital to analog converter (DAC) and an analog low pass filter. The first adder has a first input that is coupled to an output of the first ACL mixer. The third ACL NCO has a output that is coupled to a second input of the of the first adder. The second adder has a first input that is coupled to an output of the first adder. The high-pass noise generator has an output that is coupled to a second input of the second adder. The truncate has an input that is coupled to an output of the second adder. The DAC has an input that is coupled to the truncate. The analog low pass filter has an input that is coupled to and output of the DAC. An output of the analog low pass filter is coupled to the common phase modulator in the laser assembly.

Example 9 includes the RFOG with quadrature error reducer of Example 5, wherein the ACL further includes a first digital to analog (DAC), an analog attenuator, an analog adder, a third ACL NCO and a second DAC. The first DAC has a first input coupled to an output of the first ACL multiplier. The analog attenuator has a first input that is coupled to an output of the DAC. The analog adder has a first input that is coupled to an output of the analog attenuator. The second DAC has an input that is coupled to an output of the third ACL NCO. An output of the second DAC is coupled to an input of the analog adder. An output of the analog adder is coupled to the common phase modulator in the laser assembly.

Example 10 includes the RFOG with quadrature error reducer of Example 5, wherein the second harmonic phase control loop further includes a phase control loop (PCL) mixer, a PCL NCO and a PCL accumulator. The phase control loop (PCL) mixer has a first input that is coupled to the in-phase demodulator. The PCL NCO generates an amplitude modulation (AM) signal. An output of the PCL NCO is coupled to a second input of the PCL mixer. The PCL accumulator has an input that is coupled to receive an output of the PCL mixer. An output of the PCL accumulator is coupled to the first ACL NCO to control the phase of the ACL NCO.

Example 11 includes the RFOG with quadrature error reducer of Example 4, wherein the resonance tracking loop further includes an accumulator, a first adder, a register, a second adder, a numerically controlled oscillator (NCO) and direct digital synthesizer. The accumulator has an input that is selectively coupled to an output of the in-phase demodulator. The first adder has a first input that is coupled to an output of the accumulator. The register provides a nominal offset frequency. The register has an output that is coupled to a second input of the first adder. The second adder has a first input that is coupled to receive an output of the first adder. The NCO has an output that is coupled to receive a second input of the second adder. The direct digital synthesizer has an input that is coupled to receive an output of the second adder. An output of the direct digital synthesizer is coupled to the OPLL mixer in one of the CCW OPLL and the CW OPLL of the laser assembly.

Example 12 includes the RFOG with quadrature error reducer of any of the Examples 1-11, further including a Pound-Drever-Hall (PDH) loop coupled between the fiber coil and the master laser to the master laser.

Example 13 is a resonance fiber-optic gyro (RFOG) with quadrature error reducer that includes a laser assembly, a fiber resonator assembly, a quadrature error reducer circuit and a switch. The laser assembly includes a master laser, a clockwise (CW) slave laser, a CW optical phase lock loop (OPLL) to control the CW slave laser, a counter clockwise (CCW) slave laser and a CCW optical phase lock loop (OPLL) to control the CCW slave laser. The CW OPLL is coupled to receive an output of the master laser. The CCW OPLL is coupled to receive an output of the master laser. The fiber resonator assembly includes a first circulator, a second circulator and a fiber coil. The first circulator has a first input that is coupled to receive a first output of the laser assembly. The second circulator has a first input that is coupled to receive a second output of the laser assembly. The fiber coil is coupled between first outputs of the first and second circulators. The quadrature error reducer circuit is coupled to receive a second output of one of the first circulator and the second circulator. The quadrature error reducer circuit includes a first demodulator, an in-phase demodulator a quadrature demodulator, a resonance tracking loop, an amplitude control loop and a second harmonic phase control loop. The first demodulator is used to demodulate a signal from the second output of one of the first circulator and the second circulator at two times a common modulation frequency. The in-phase demodulator is coupled to demodulate an output of the first demodulator at the common modulation frequency. The quadrature demodulator is coupled to also demodulate the output of the first demodulator at the common modulation frequency. The resonance tracking loop has an input that is coupled to receive an output of the in-phase demodulator. The resonance tracking loop is configured to generate a resonance frequency signal. An output of the resonance tracking loop is coupled to an OPLL mixer in one of the CCW OPLL and the CW OPLL of the laser assembly. The amplitude control loop has an input that is coupled to receive an output of the quadrature demodulator. The amplitude control loop is configured to generate a common modulation signal. An output of the amplitude control loop is coupled to a common phase modulator in the laser assembly. The second harmonic phase control loop is used to selectively adjust a phase of a second harmonic modulation signal in the amplitude control loop at startup. The switch is positioned within the resonance tracking loop configured and arranged to open the resonance tracking loop at startup of the RFOG and close the resonance tracking loop when a second harmonic modulation output of zero is achieved.

Example 14 includes the RFOG with quadrature error reducer of Example 13, wherein the amplitude control loop (ACL) further includes an accumulator, a first ACL multiplier, a second ACL multiplier, a first ACL numerically controlled oscillator (NCO) and a second ACL NCO. The accumulator has an input that is coupled to an output of the quadrature demodulator. The first ACL multiplier has a first input that is coupled to an output of the accumulator. The second ACL multiplier has an output that is coupled to a second input of the first ACL multiplier. The first ACL NCO has an output that is coupled to a first input of the second ACL multiplier. The output of the first ACL NCO is at two times the frequency of the common modulation frequency. The second ACL NCO has an output that is coupled to a second input of the second ACL mixer. The output of the second NCO is at a select amplitude modulation frequency. Further wherein the second harmonic phase control loop further includes a phase control loop (PCL) mixer, a PCL NCO, and a PCL accumulator. The phase control loop (PCL) mixer has a first input coupled to the in-phase demodulator. The PCL NCO generates an amplitude modulation (AM) signal. An output of the PCL NCO is coupled to a second input of the PCL mixer. The PCL accumulator has an input that is coupled to receive an output of the PCL mixer. An output of the PCL accumulator is coupled to the first ACL NCO to control the phase of the ACL NCO.

Example 15 is a method of reducing quadrature error in a resonance fiber-optic gyro (RFOG), the method includes: Amplitude modulating a second harmonic modulation output from an quadrature demodulator; demodulating an output of an in-phase demodulator at an amplitude modulation frequency; and adjusting the phase of the second harmonic modulation output based at least in part on the demodulated output of the in-phase demodulator until a second harmonic modulation output of zero is achieved.

Example 16 includes the method of Example 15, further including acquiring resonant frequency at startup of the RFOG with a resonance tracking loop of a quadrature error reducer circuit.

Example 17 includes the method of any of the Examples 15-17, wherein adjusting the phase of the second harmonic modulation output based at least in part on the demodulated output of the in-phase demodulator until a second harmonic modulation output of zero is achieved by applying a phase control loop to an amplitude control loop.

Example 18 includes the method of Example 17, wherein applying the phase control loop to the amplitude control loop, further includes opening a resonance tracking loop of a quadrature error reducer circuit after a resonance frequency is acquired.

Example 19 includes the method of Example 18, further including closing the resonance tracking loop once the phase of the second harmonic modulation output has reach zero.

Example 20 includes the method of any of the Examples 16-19, further comprising communicating a resonance frequency signal to an optical phase lock loop of a laser assembly with the resonance tracking loop; and communicating a common modulation frequency signal to a common phase modulator in the laser assembly with the amplitude control loop.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A resonance fiber-optic gyro (RFOG) with quadrature error reducer comprising:
   a laser assembly including,
      a master laser,
      a clockwise (CW) slave laser,
      a CW optical phase lock loop (OPLL) to control the CW slave laser, the CW OPLL coupled to receive an output of the master laser,
      a counter clockwise (CCW) slave laser, and
      a CCW optical phase lock loop (OPLL) to control the CCW slave laser,
   the CCW OPLL coupled to receive an output of the master laser,
   a fiber resonator assembly including,
      a first circulator having a first input coupled to receive a first output of the laser assembly,
      a second circulator having a first input coupled to receive a second output of the laser assembly, and
      a fiber coil coupled between first outputs of the first and second circulators;
   a resonance tracking loop to generate a resonance frequency signal, an output of the resonance tracking loop coupled to a OPLL mixer in one of the CCW OPLL and the CW OPLL of the laser assembly; and
   a quadrature error reducer circuit coupled to receive a second output of one of the first circulator and the second circulator, the quadrature error reducer circuit including,
      an amplitude control loop to generate a common modulation signal, an output of the amplitude control loop coupled to a common phase modulator in the laser assembly;
      a second harmonic phase control loop to selectively adjust a phase of a second harmonic modulation signal in the amplitude control loop at startup;
      a first demodulator to demodulate a signal in the second output of one of the first circulator and the second circulator at two times a common modulation frequency;
      an in-phase demodulator coupled to demodulate an output of the first demodulator at the common modulation frequency, an output of the in-phase demodulator coupled to the resonance tracking loop; and
      a quadrature demodulator coupled to also demodulate the output of the first demodulator at the common modulation frequency, an output of the quadrature demodulator coupled to the amplitude control loop.

2. The RFOG with quadrature error reducer of claim 1, further wherein the second harmonic phase control loop configured and arranged to provide an output to the amplitude control loop when the resonance tacking loop is opened.

3. The RFOG with quadrature error reducer of claim 2, further comprising:
   a switch within the resonance tracking loop configured and arranged to open the resonance tracking loop at startup of the RFOG and close the resonance tracking loop when a second harmonic modulation output of zero is achieved.

4. The RFOG with quadrature error reducer of claim 1, wherein the amplitude control loop (ACL) further comprises:
   an accumulator having an input coupled to an output of the quadrature demodulator;
   a first ACL multiplier having a first input coupled to an output of the accumulator;
   a second ACL multiplier having an output coupled to a second input of the first ACL multiplier;
   a first ACL numerically controlled oscillator (NCO) having an output coupled to a first input of the second ACL multiplier, the output of the first ACL NCO being at two times the frequency of the common modulation frequency; and
   a second ACL NCO having an output coupled to a second input of the second ACL multiplier, the output of the second ACL NCO being at a select amplitude modulation frequency.

5. The RFOG with quadrature error reducer of claim 4, wherein the ACL further comprises:
   an adder having a first input coupled to an output of the first ACL multiplier;
   a third ACL NCO having an output coupled to a second input of the adder; and
   a digital to analog converter (DAC) having an input coupled to an output of the adder, an output of the DAC coupled to the common phase modulator in the laser assembly.

6. The RFOG with quadrature error reducer of claim 5, wherein the DAC of the ACL is a delta-sigma DAC.

7. The RFOG with quadrature error reducer of claim 4, wherein the ACL further comprises:
   a first adder having a first input coupled to an output of the first ACL mixer;
   a third ACL NCO having a output coupled to a second input of the of the first adder;
   a second adder having a first input coupled to an output of the first adder;
   a high-pass noise generator having an output coupled to a second input of the second adder;
   a truncate having an input coupled to an output of the second adder;
   a digital to analog converter (DAC) having an input coupled to the truncate; and
   an analog low pass filter having an input coupled to an output of the DAC, an output of the analog low pass filter coupled to the common phase modulator in the laser assembly.

8. The RFOG with quadrature error reducer of claim 4, wherein the ACL further comprises:
   a first digital to analog (DAC) having a first input coupled to an output of the first ACL multiplier;
   an analog attenuator having a first input coupled to an output of the DAC;
   an analog adder having a first input coupled to an output of the analog attenuator;
   a third ACL NCO; and
   a second DAC having an input coupled to an output of the third ACL NCO, an output of the second DAC coupled to an input of the analog adder, an output of the analog adder coupled to the common phase modulator in the laser assembly.

9. The RFOG with quadrature error reducer of claim 4, wherein the second harmonic phase control loop further comprises:
   a phase control loop (PCL) mixer having a first input coupled to the in-phase demodulator,
   a PCL NCO generating an amplitude modulation (AM) signal, an output of the PCL NCO coupled to a second input of the PCL mixer;
   a PCL accumulator having an input coupled to receive an output of the PCL multiplier, an output of the PCL accumulator coupled to the first ACL NCO to control the phase of the ACL NCO.

10. The RFOG with quadrature error reducer of claim 1, wherein the resonance tracking loop further comprises:
    an accumulator having an input selectively coupled to an output of the in-phase demodulator;
    an first adder having a first input coupled to an output of the accumulator;
    a register to provide a nominal offset frequency, the register having an output coupled to a second input of the first adder;
    a second adder having a first input coupled to receive an output of the first adder;
    a numerically controlled oscillator (NCO) having an output coupled to receive a second input of the second adder; and
    a direct digital synthesizer having an input coupled to receive an output of the second adder, an output of the direct digital synthesizer coupled to the OPLL mixer in one of the CCW OPLL and the CW OPLL of the laser assembly.

11. The RFOG with quadrature error reducer of claim 1, further comprising:
    a Pound-Drever-Hall (PDH) loop coupled between the fiber coil and the master laser to the master laser.

12. A resonance fiber-optic gyro (RFOG) with quadrature error reducer comprising:
    a laser assembly including,
       a master laser;
       a clockwise (CW) slave laser;
       a CW optical phase lock loop (OPLL) to control the CW slave laser, the CW OPLL coupled to receive an output of the master laser;
       a counter clockwise (CCW) slave laser; and
       a CCW optical phase lock loop (OPLL) to control the CCW slave laser,
    the CCW OPLL coupled to receive an output of the master laser;
    a fiber resonator assembly including,
       a first circulator having a first input coupled to receive a first output of the laser assembly;
       a second circulator having a first input coupled to receive a second output of the laser assembly; and
       a fiber coil coupled between first outputs of the first and second circulators;
    a quadrature error reducer circuit coupled to receive a second output of one of the first circulator and the second circulator, the quadrature error reducer circuit including, a first demodulator to demodulate a signal from the second output of one of the first circulator and the second circulator at two times a common modulation frequency;
an in-phase demodulator coupled to demodulate an output of the first demodulator at the common modulation frequency;
a quadrature demodulator coupled to also demodulate the output of the first demodulator at the common modulation frequency;
a resonance tracking loop having an input coupled to receive an output of the in-phase demodulator, the resonance tracking loop configured to generate a resonance frequency signal, an output of the resonance tracking loop coupled to a OPLL mixer in one of the CCW OPLL and the CW OPLL of the laser assembly;
an amplitude control loop having an input coupled to receive an output of the quadrature demodulator, the amplitude control loop configured to generate a common modulation signal, an output of the amplitude control loop coupled to a common phase modulator in the laser assembly;
a second harmonic phase control loop to selectively adjust a phase of a second harmonic modulation signal in the amplitude control loop at startup; and
a switch within the resonance tracking loop configured and arranged to open the resonance tracking loop at startup of the RFOG and close the resonance tracking loop when a second harmonic modulation output of zero is achieved.

13. The RFOG with quadrature error reducer of claim 12, wherein:
the amplitude control loop (ACL) further comprises:
an accumulator having an input coupled to an output of the quadrature demodulator;
a first ACL multiplier having a first input coupled to an output of the accumulator;
a second ACL multiplier having an output coupled to a second input of the first ACL mixer;
a first ACL numerically controlled oscillator (NCO) having an output coupled to a first input of the second ACL multiplier, the output of the first ACL NCO being at two times the frequency of the common modulation frequency; and
a second ACL NCO having an output coupled to a second input of the second ACL multiplier, the output of the second NCO being at a select amplitude modulation frequency; and
the second harmonic phase control loop further comprises:
a phase control loop (PCL) mixer having a first input coupled to the in-phase demodulator;
a PCL NCO generating an amplitude modulation (AM) signal, an output of the PCL NCO coupled to a second input of the PCL mixer; and
a PCL accumulator having an input coupled to receive an output of the PCL mixer, an output of the PCL accumulator coupled to the first ACL NCO to control the phase of the ACL NCO.

* * * * *